(12) United States Patent
Sheen

(10) Patent No.: US 8,187,901 B2
(45) Date of Patent: May 29, 2012

(54) EPITAXIAL FORMATION SUPPORT STRUCTURES AND ASSOCIATED METHODS

(75) Inventor: Calvin Wade Sheen, Derry, NH (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/961,370

(22) Filed: Dec. 6, 2010

(65) Prior Publication Data

US 2011/0136281 A1    Jun. 9, 2011

Related U.S. Application Data

(60) Provisional application No. 61/267,134, filed on Dec. 7, 2009.

(51) Int. Cl.
*H01L 21/00* (2006.01)

(52) U.S. Cl. ............... 438/46; 438/458; 257/E21.497

(58) Field of Classification Search ............ 438/46, 438/455, 458; 257/E21.497
See application file for complete search history.

(56) References Cited

U.S. PATENT DOCUMENTS

| | | | |
|---|---|---|---|
| 4,563,383 A | 1/1986 | Kuneman et al. | |
| 7,105,070 B2 | 9/2006 | Tosa et al. | |
| 7,130,174 B2 | 10/2006 | Miyai et al. | |
| 7,514,721 B2 | 4/2009 | Krames et al. | |
| 7,569,177 B2 | 8/2009 | Saitoh et al. | |
| 2006/0128118 A1 | 6/2006 | Nagahama et al. | |
| 2006/0147746 A1 | 7/2006 | Wakako et al. | |
| 2006/0163605 A1* | 7/2006 | Miyahara | 257/103 |
| 2007/0287012 A1 | 12/2007 | Kawai et al. | |
| 2009/0184624 A1 | 7/2009 | Schmidt et al. | |
| 2010/0142181 A1* | 6/2010 | Schmidt et al. | 362/84 |
| 2010/0219419 A1 | 9/2010 | Hata et al. | |

FOREIGN PATENT DOCUMENTS

| | | |
|---|---|---|
| JP | 2008066717 A | 3/2008 |
| JP | 2009064842 A | 3/2009 |

OTHER PUBLICATIONS

International Search Report and Written Opinion issued Aug. 2, 2011 in International Application No. PCT/US2010/059283, 8 pages.

(Continued)

*Primary Examiner* — Jarrett Stark
*Assistant Examiner* — John M Parker
(74) *Attorney, Agent, or Firm* — Perkins Coie LLP

(57) ABSTRACT

Epitaxial formation support structures and associated methods of manufacturing epitaxial formation support structures and solid state lighting devices are disclosed herein. In several embodiments, a method of manufacturing an epitaxial formation support substrate can include forming an uncured support substrate that has a first side, a second side opposite the first side, and coefficient of thermal expansion substantially similar to N-type gallium nitride. The method can further include positioning the first side of the uncured support substrate on a first surface of a first reference plate and positioning a second surface of a second reference plate on the second side to form a stack. The first and second surfaces can include uniformly flat portions. The method can also include firing the stack to sinter the uncured support substrate. At least side of the support substrate can form a planar surface that is substantially uniformly flat.

23 Claims, 8 Drawing Sheets

OTHER PUBLICATIONS

Atwater Jr., H.A., Ion Beam Enhanced Grain Growth in Thin Films, RLE Technical Report No. 527, Massachusetts Institute of Technology, Research Laboratory of Electronics, pp. 1-224, Mar. 1987.

Atwater, H.A. et al., Mechanisms for Crystallographic Orientation in the Crystallization of Thin Silicon Films from the Melt, J. Mater. Res., vol. 3, No. 6, pp. 1232-1237, Nov./Dec. 1988.

Atwater, H.A. et al., Zone-Melting Recrystallization of Thick Silicon on Insulator Films, Materials Letters, vol. 2, No. 4A, pp. 269-273, Mar. 1984.

Choi, J.-H. et al. Zone Melting Recrystallization of Polysilicon by a Focused-Lamp with Unsymmetric Trapezoidal Power Distribution, Journal of Electronic Materials, vol. 20, No. 3, pp. 231-235, Mar. 1991.

Colinge, J.-P., Silicon-on-Insulator Technology: Materials to VLSI, 2nd Edition, pp. 16-27 and 52-65, Sep. 1997.

Geis, M.W. et al., (Invited) Silicon Graphoepitaxy, Proceedings of the 12th Conference on Solid State Devices, Tokyo 1980, Japanese Journal of Applied Physics, vol. 20, Supplement 20-1, pp. 39-42, 1981.

Geis, M.W. et al., Grapho-Epitaxy of Silicon on Fused Silica using Surface Micropatterns and Laser Crystallization, J. Vac. Sci. Technol., vol. 16, No. 6, pp. 1640-1643, Nov./Dec. 1979.

Geis, M.W. et al., Summary Abstract: Silicon Graphoepitaxy, J. Vac. Sci. Technol., vol. 18, No. 2, pp.-229-230, Mar. 1981.

Geis, M.W. et al., Zone-Melting Recrystallization of Si Films with a Moveable-Strip-Heater Oven, J. Electrochem. Soc.: Solid State Science and Technology, vol. 129, No. 12, pp. 2812-2818, Dec. 1982.

Givargizov, E.I., Graphoepitaxy as an Approach to Oriented Crystallization on Amorphous Substrates, Journal of Crystal Growth, vol. 310, No. 7-9, pp.-1686-1690, Apr. 2008.

Klykov, V.I. et al. Artificial Epitaxy (Diataxy) of Silicon and Germanium, Acta Physica Academiae Scientiarum Hungaricae, vol. 47, Nos. 1-3, pp. 167-183, Mar. 1979.

Minagawa, Y. et al. Fabrication of (111)-Oriented Si Film with a Ni/Ti Layer by Metal Induced Crystallization, Jpn. J. Appl. Phys., vol. 20, Part 2, No. 3A, pp. L186-L188, Mar. 2001.

Moon, B.Y. et al. Study on the Polycrystalline Silicon Films Deposited by Inductively Coupled Plasma Chemical Vapor Deposition, Mat. Res. Soc. Symp. Proc., vol. 685E, pp. D5.2.1-D5.2.6, 2001.

Naomoto, H. et al., Characterization of Thin-Film Silicon Formed by High-Speed Zone-Melting Recrystallization Process, Solar Energy Materials and Solar Cells, Vol. 48, Nos. 1-4, pp. 261-267, Nov. 1997.

Pauli, M. et al., Large Area and Rapid Thermal Zone Melting Crystallization of Silicon Films on Graphite Substrates for Photovoltaic Use, Conference Record of the 23rd IEEE Photovoltaic Specialists Conference, pp. 195-200, May 1993.

Scharff, W. et al., Flash-Lamp-Induced Crystal Growth of Silicon on Amorphous Substrates Using Artificial Surface-Relief Structures, Physica Status Solidi (a), vol. 74, No. 2, pp. 545-552, Dec. 1982.

Wan, J. et al., Growth of Crack-Free Hexagonal GaN Films on Si(100), Applied Physics Letters, vol. 79, No. 10, pp. 1459-1461, Sep. 2001.

Yoon, S.M. et al., Numerical Simulation of Scanning Speed and Supercooling Effects During Zone-Melting-Recrystallization of SOI Wafers, Mat. Res. Soc. Symp. Proc., vol. 205, pp. 453-458, 1990.

* cited by examiner

EPITAXIAL FORMATION SUPPORT STRUCTURES AND ASSOCIATED METHODS

CROSS-REFERENCE TO RELATED APPLICATION(S)

The present application claims priority to U.S. Provisional Application No. 61/267,134 filed on Dec. 7, 2009, the disclosure of which is incorporated herein by reference.

TECHNICAL FIELD

The present disclosure is related to epitaxial formation structures and associated methods of manufacturing epitaxial formation structures and solid state lighting ("SSL") devices.

BACKGROUND

SSL devices generally use semiconductor light emitting diodes ("LEDs"), organic light emitting diodes ("OLED"), and/or polymer light emitting diodes ("PLED") as sources of illumination rather than electrical filaments, plasma, or gas. For example, FIG. 1 is a schematic cross-sectional diagram of a conventional indium-gallium nitride (InGaN) LED 10. As shown in FIG. 1, the LED 10 includes a substrate material 12 (e.g., silicon), N-type gallium nitride (GaN) 14, GaN/InGaN multiple quantum wells ("MQWs") 16, and P-type GaN 18. The LED 10 also includes a first contact 20 on the P-type GaN 18 and a second contact 22 on the N-type GaN 14. During manufacturing, the N-type GaN 14, the GaN/InGaN MQWs 16, and the P-type GaN 18 are formed on the substrate material 12 via metal organic chemical vapor deposition ("MOCVD"), molecular beam epitaxy ("MBE"), liquid phase epitaxy ("LPE"), hydride vapor phase epitaxy ("HVPE"), and/or other epitaxial growth techniques, each of which is typically performed at elevated temperatures.

One operational difficulty of forming the LED 10 is that the N-type GaN 14, the GaN/InGaN MQWs 16, and the P-type GaN 18 may be delaminated from the substrate material 12 and/or otherwise damaged during high-temperature epitaxial growth and/or cool-down thereafter. Typically, the substrate material 12 includes silicon (Si), sapphire ($Al_2O_3$), silicon carbide (SiC), and/or other "non-native" materials because "native" materials (e.g., GaN or InGaN) with usable dimensions are difficult to produce. The non-native substrate materials have different coefficients of thermal expansion ("CTEs") than the GaN/InGaN materials 14, 16, and 18. For example, the CTE of silicon is substantially less than that of GaN, and the CTE of sapphire is substantially greater than that of GaN. Such CTE differentials induce thermal stress as the wafer cools, which warp the substrate material 12 and/or cause crystal defects in epitaxial GaN/InGaN materials 14, 16, and 18. Additionally, the non-native substrate materials that facilitate particularly good epitaxial growth, such as Si(1, 1,1) silicon wafer, can be expensive. Accordingly, several improvements in reliably and cost-effectively manufacturing SSL devices may be desirable.

DETAILED DESCRIPTION

Various embodiments of apparatuses for manufacturing epitaxial formation support substrates and associated methods of manufacturing epitaxial formation structures and solid state lighting ("SSL") devices are described below. As used hereinafter, the term "SSL device" generally refers to devices with semiconductor light-emitting diodes ("LEDs"), polymer light-emitting diodes ("PLEDs"), organic light-emitting diodes ("OLEDs"), or other types of solid state devices that convert electrical energy into electromagnetic radiation in a desired spectrum. Additionally, the term substrate refers to supports for individual SSL devices and larger wafers that can support a plurality of SSL devices. A person skilled in the relevant art will also understand that the technology may have additional embodiments, and that the technology may be practiced without several of the details of the embodiments described below with reference to FIGS. 2-6.

Figure 1:
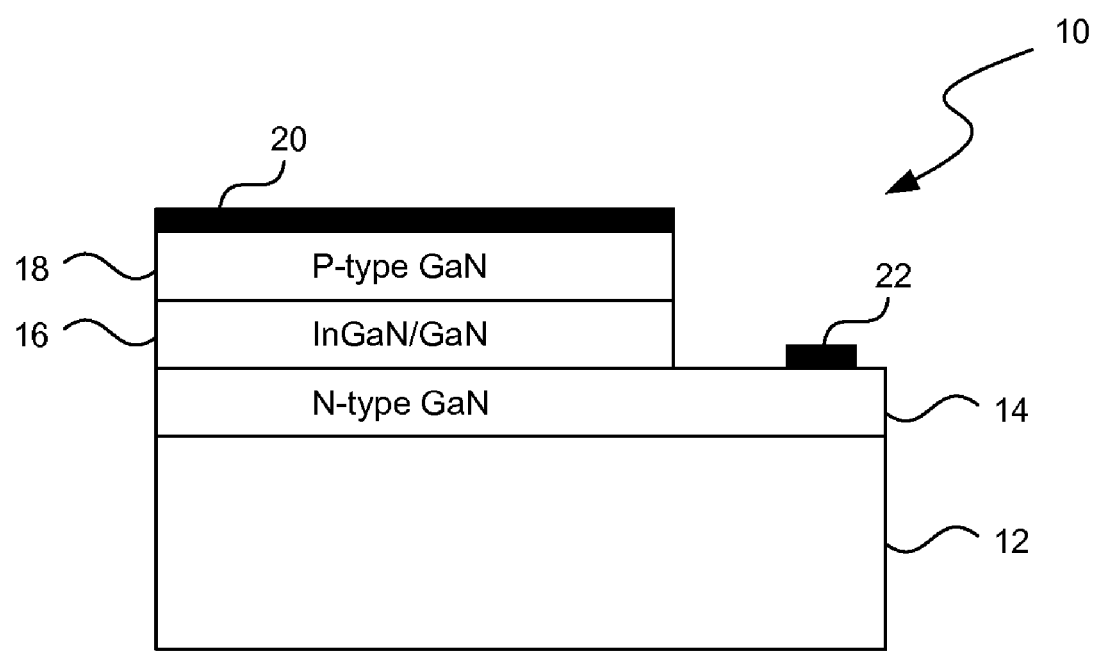
FIG. 1 is a schematic cross-sectional view of an LED device in accordance with the prior art.
Figure 2:
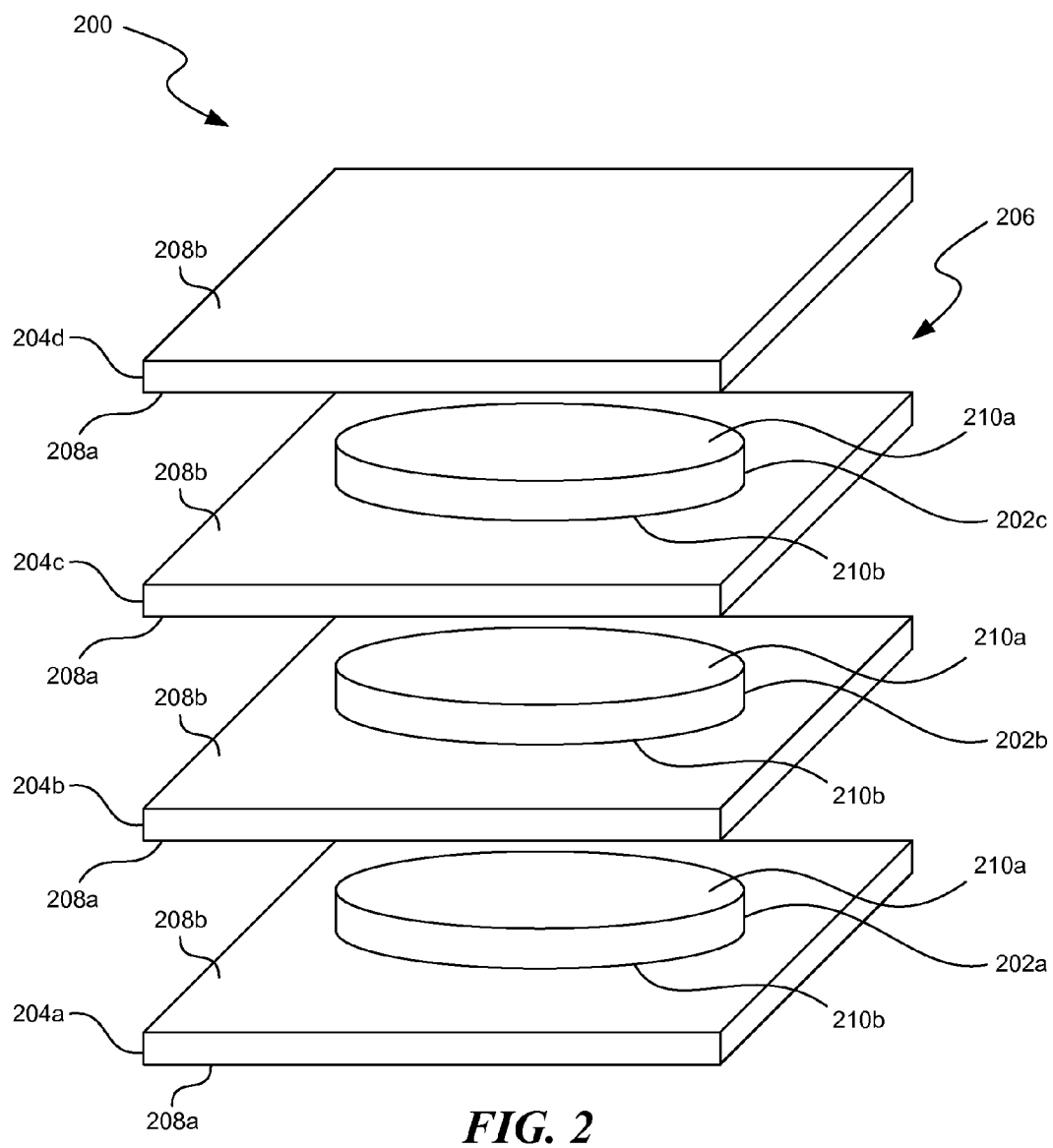
FIG. 2 is an exploded view of an apparatus for manufacturing epitaxial formation support substrates in accordance with embodiments of the technology.

FIG. 2 is an exploded view of an apparatus 200 for forming epitaxial formation support substrates in accordance with embodiments of the technology. The apparatus 200 can include a plurality of reference plates 204 (identified individually as first, second, third, and fourth reference plates 204a-d, respectively) sequentially stacked above one another. As shown in FIG. 2, a plurality of support substrates 202 (identified individually as a first-third support substrates 202a-c) can be positioned between the reference plates 204 to form a stack 206 of alternating reference plates 204 and support substrates 202. In other embodiments, more than one support substrate 202 can be positioned between two consecutively stacked reference plates 204 (e.g., the first reference plate 204a and the second reference plate 204b).

The support substrates 202 can be made from a polycrystalline ceramic material having a coefficient of thermal expansion (CTE) substantially similar to the CTE of N-type gallium nitride (GaN) and/or other III-nitrides. For example, the support substrates 202 can be made from compositions of $Si_3N_4$, TiN, ZrN, HfN, AlN, $SiO_2$, $Al_2O_3$, AlON, TiC, ZrC, HfC, SiC, $Y_2O_3$ and/or other suitable polycrystalline ceramics. In some embodiments, the support substrates 202 can include impurities that are inconsequential to the thermal characteristics of the support substrates 202 as a whole. In other embodiments, the support substrates 202 can include sintering agents to aid in subsequent firing processes. Additionally, the support substrates 202 can include agents used to alter properties associated with the polycrystalline ceramic.

The support substrates 202 can be formed by tape casting a ceramic slurry into a putty-like material. The ceramic slurry can be pressed or extruded into a sheet having a desired thickness, and the support substrates 202 can be cut from the sheet while in a green (i.e., unfired state). In other embodiments, the support substrates 202 can be individually formed from the ceramic slurry into desired shapes and sizes. For example, the support substrates 202 can be shaped into discs as shown in FIG. 2 and/or other suitable shapes for supporting epitaxial growth of SSL structures. In further embodiments, the support substrates 202 can be sized to compensate for shrinkage of the ceramic during subsequent firing. For example, if the ceramic shrinks 30% during firing, the support substrates 202 can have an initial size approximately 50% larger than a desired size.

As shown in FIG. 2, each reference plate 204 can include a first surface 208a and a second surface 208b opposite the first surface 208a. The first and second surfaces 208 can be uniformly flat and planar. The reference plates 204, for example, can be polished, lapped, and/or otherwise machined to increase the uniformity and flatness of the first and/or second surfaces 208. As such, the reference plates 204 are made from rigid materials that maintain the uniformity and flatness of portions of first and second surfaces 208a-b during firing. For example, the reference plates 204 can be made from aluminum nitride, sapphire, and/or other suitable materials that will maintain the desired surface finish during and after firing.

The planar first and second surfaces 208 can press the support substrates 202 while the ceramic material is in a green state to form at least one side of each support substrate 202 into a correspondingly planar surface. In the embodiment illustrated in FIG. 2, for example, each support substrate 202 has a first side 210a and a second side 210b opposite the first side 210a. Accordingly, the second surface 208b of the first reference plate 204a can contact the second side 210a of the first support substrate 202a, the first surface 208a of the second reference plate 204b can contact the first side 210b of the first support substrate 202a, and the second surface 208b of the second reference plate 204b can contact a second side 210b of the subsequently stacked second support substrate 202b. The third and fourth reference plates 204c and 204d can be similarly stacked on the second and third support substrates 202b-c such that the first and second sides 210 of the support substrate 202b-c contact corresponding first and second surfaces 208 of the third and fourth reference plates 204c-d. In other embodiments, the first and/or second surfaces 208 can include uniformly flat portions and/or the reference plates 204 can include only one uniformly flat portions. For example, the first surface 208a of the first reference plate 204a need not be uniformly flat because the first surface 208a does not contact any of the support substrates 202.

The apparatus 200 can reduce post-firing machining of the fired support substrates 202 because the reference plates 204 flatten the first side 210a or the second side 210b of the support substrates 202 during firing. For example, the first and/or second sides 210 generally need at most one machine process to form the desired flat surface on the fired support substrates 202. Each flattened side 210 provides a support surface for a formation structure (described below) on which SSL structures can epitaxially grow. The flat surfaces of the support substrates 202 can reduce or substantially eliminate warp and the translation of warp from the support substrate 202 to the SSL structure during epitaxial growth. For example, warp from the support substrate 202 to the SSL structure can be less than 25 micrometers.

Figure 3A:
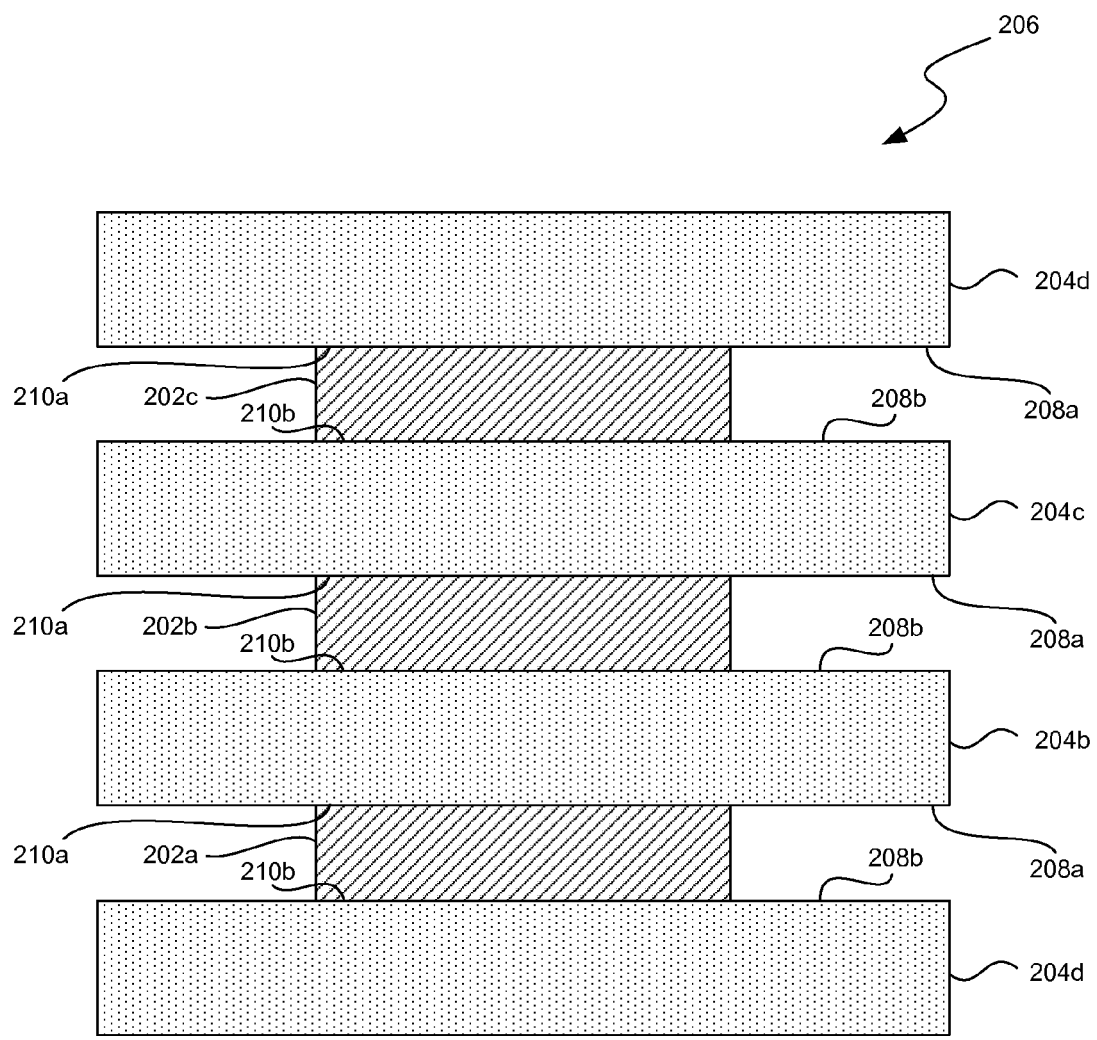
FIGS. 3A-C are schematic cross-sectional views of a process for manufacturing epitaxial formation support substrates in accordance with embodiments of the technology.

FIGS. 3A-D are schematic cross-sectional views that illustrate a process for manufacturing epitaxial formation support substrates in accordance with embodiments of the technology. The process can use the apparatus 200 described in FIG. 2 to form the support substrates 202 such that they facilitate uniform epitaxial growth. More specifically, FIG. 3A shows the process can include stacking a plurality of uncured support substrates 202 between the plurality of reference plates 204. The reference plates 204 and the uncured support substrates 202 can be stacked in an alternating manner to form the stack 206. For example, as shown in FIG. 3A, the uncured support substrates 202 can be positioned in the stack 206 such that the first and second sides 210 of each support substrate 202 contacts the corresponding first and second surfaces 208 of the reference plates 204. In other embodiments, the stack 206 can include more or less uncured support substrates 202 positioned between reference plates 204 and/or multiple reference plates 204 can be positioned over each uncured support substrate 202. In further embodiments, only one side 210 of each uncured support substrate 202 can contact one planar surface 208.

Figure 3B:
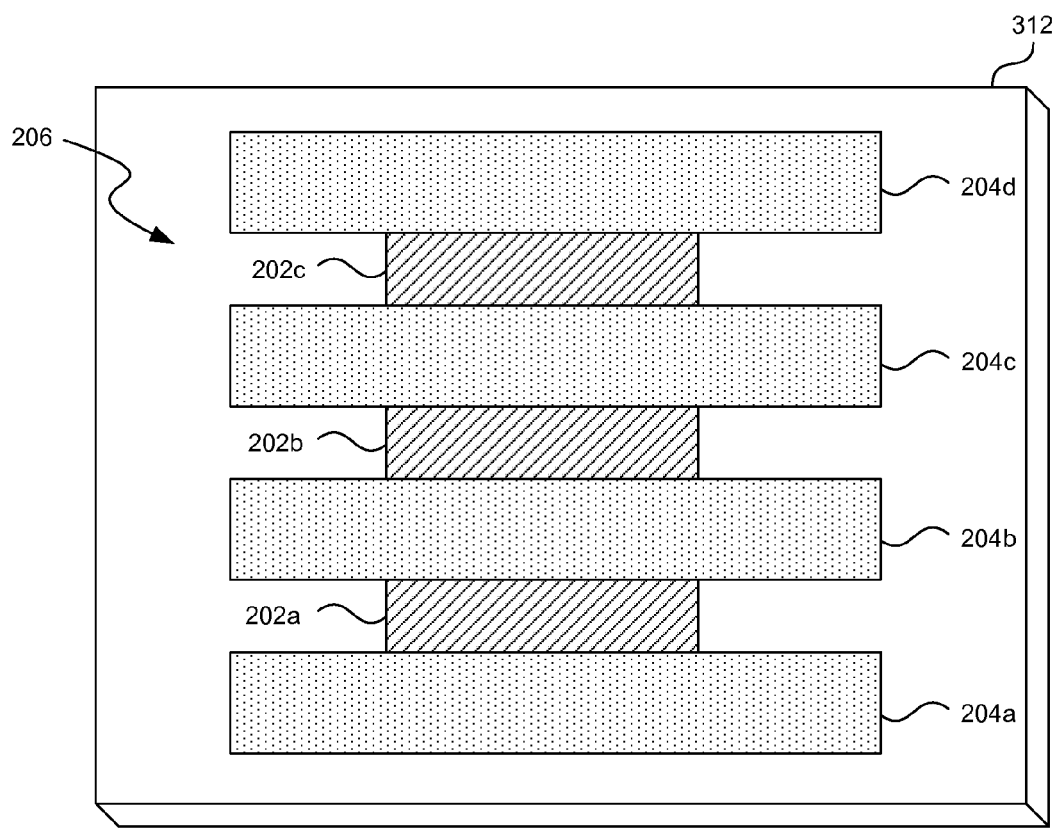

As shown in FIG. 3B, the process can also include sintering the stack 206 in a firing furnace 312. The firing furnace 312 can be a suitable furnace for sintering ceramic materials, such as the uncured support substrates 202. During this step, the heat from the firing furnace 312 and the gravitational force from the reference plates 204 can flatten at least one of the sides 210 of the uncured support substrates 202 into a planar surface corresponding to the uniformly flat surfaces 208 of the reference plates 204. In other embodiments, external pressure and/or additional weights can also be applied to the stack 206 during firing to further flatten the sides 210.

After the ceramic material of the support substrates 202 is cured and at least one side 210 has at least a generally planar surface, each of the support substrates 202 can be separated from the stack 206. To ease removal of the support substrates 202 from the stack 206, a release agent can be used to prevent the support substrates 202 from bonding or otherwise affixing to the reference plates 204. For example, in some embodiments, the release agent may be applied to the reference plates 204 and/or to the support substrates 202 before to stacking Suitable release agents can include, for example, boron nitride.

Figure 3C:
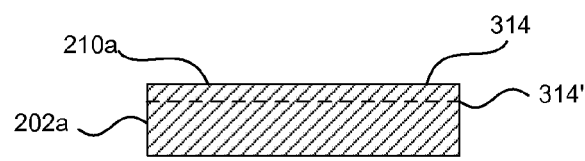

FIG. 3C shows the first support substrate 202a after removal from the stack 206. The first support substrate 202a can have a planar surface 314 at the first side 210a corresponding to the uniformly flat first surface 208a of the second reference plate 204b. In some embodiments, the planar surface 314 can be flat enough to support uniform, epitaxial growth of SSL structures. In other embodiments, the planar surface 314 can be machined to produce a more uniformly planar surface for more uniform epitaxial growth of the SSL structures. As shown in the embodiment illustrated FIG. 3C, the planar surface 314 can be planarized by removing a portion of the first support substrate 202a to form a more planar surface 314' (shown in broken lines) to support uniform epitaxial growth. However, subsequent machining of the planar surface 314 is minimal, and, in some embodiments, can be limited to a single process. Suitable machine processes can include polishing, lapping, chemical-mechanical planarization or other processes that can be a highly planar surface 314 on the support substrates 202.

FIGS. 4A-D are schematic cross-sectional views of a process for manufacturing SSL devices on epitaxial formation support substrates in accordance with embodiments of the technology. More specifically, the SSL devices can be formed on one of the support substrates 202 manufactured using the process described with reference to FIGS. 3A-C. Even though only certain method steps are illustrated in FIGS. 4A-D, the method for forming the SSL devices can also include other stages for forming a lens, a mirror, a carrier structure, conductive interconnects, electrical contacts, and/or other suitable mechanical/electrical components (not shown).

Figure 4A:
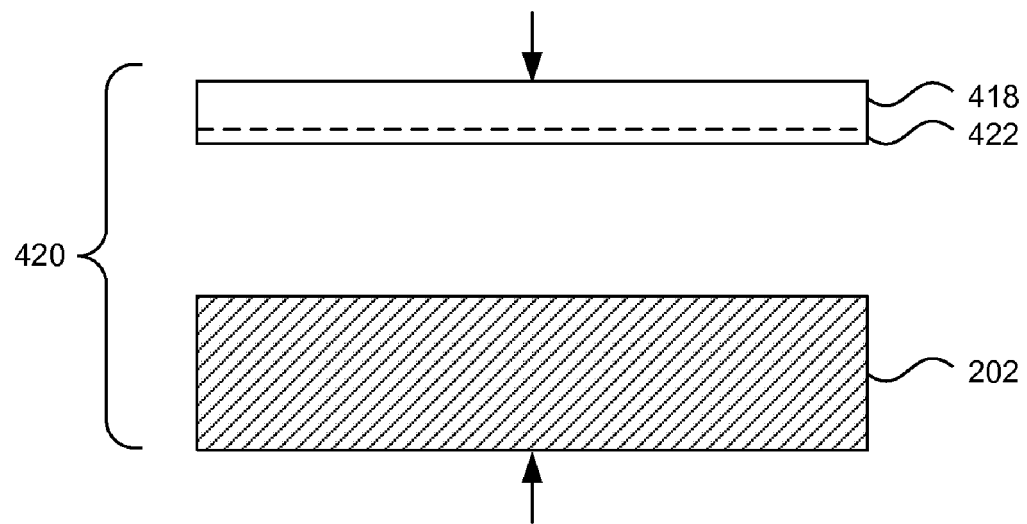
FIGS. 4A-D are schematic cross-sectional views of a process for manufacturing an SSL device in accordance with embodiments of the technology.

As shown in FIG. 4A, the process can include attaching a formation structure 418 to the planar surface 314 of the support substrate 202 to form a template structure 420. The formation structure 418 can be made from a material that facilitates epitaxial growth of III-nitride devices. In some embodiments, for example, the formation structure 418 can include silicon (Si), at least a portion of which has the Si(1, 1,1) crystal orientation. In other embodiments, the formation structure 418 can include silicon with other crystal orientations (e.g., Si(1,0,0)), aluminum gallium nitride (AlGaN), GaN, SiC, $Al_2O_3$, zinc oxide ($ZnO_2$), gallium arsenide (GaAs), a combination of the foregoing materials, and/or other suitable materials.

In the embodiment illustrated in FIG. 4A, the formation structure 418 includes a bonding region 422 configured to bond with the planar surface 314 of the support substrate 202. The bonding region 422 may be doped with an exfoliation agent (e.g., hydrogen (H or $H_2$), boron (B), helium (He), or any combination thereof) using ion implantation and/or other suitable techniques. In other embodiments, the bonding region 422 may be omitted. In some embodiments, the formation structure 418 can be attached to the planar surface 314 using solid-solid bonding techniques. For example, the formation structure 418 and the support substrate 202 may be mechanically pressed against each other while being heated to a bonding temperature (e.g., 300° C.). In other embodiments, the formation structure 418 and the support substrate 202 may be attached using an adhesive material (not shown) and/or other suitable techniques.

Figure 4B:
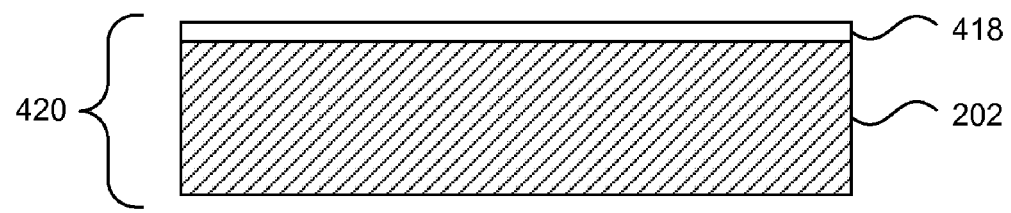

FIG. 4B shows another step in the process in which the formation structure 418 is thinned such that thermal expansion characteristics of the template structure 420 are dominated by the CTE of the support substrate 202. For example, the remaining formation structure 418 can have a thickness of about 10 nanometers to about 2 micrometers, or can have other suitable thicknesses such that the CTE temperature dependency of the template structure 420 generally corresponds to that of the support substrate 202. In one embodiment, the portion of the formation structure 418 can be removed through exfoliation of the dopant (e.g., hydrogen (H or $H_2$), boron (B), or helium (He), or any combination thereof) at a temperature of about 250° C. for hydrogen and boron compounds, and about 400° C. for hydrogen or hydrogen and helium compounds. In other embodiments, the portion of the formation structure 418 may be removed using CMP, ECMP, dry etching, wet etching, and/or other suitable material removal techniques.

Figure 4C:
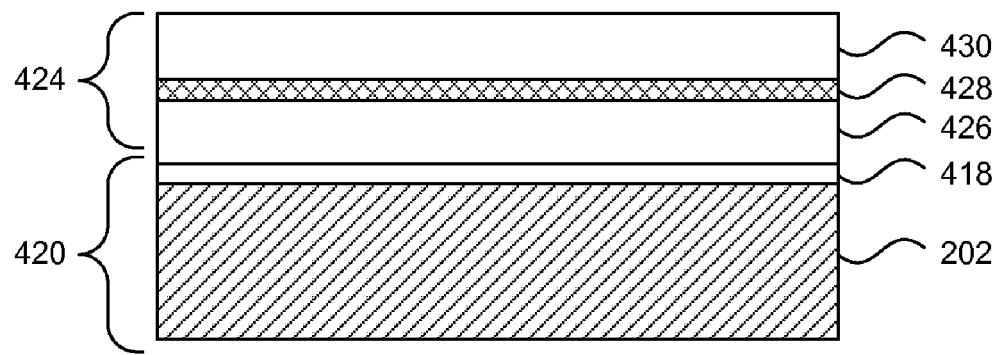

As shown in FIG. 4C, the process can further include forming an SSL structure 424 on the formation structure 418. In the illustrated embodiment, the SSL structure 424 can include a first semiconductor material 426, an active region 428, and a second semiconductor material 430 formed via MOCVD, MBE, LPE, HVPE, and/or other suitable epitaxial growth techniques. In other embodiments, the SSL structure 424 can also include other suitable components, such as a buffer material that facilitates the formation of the first and second semiconductor materials 426 and 430 and the active region 428 on the formation structure 418. In further embodiments, the SSL structure 424 can include additional bonding and seed layers to facilitate bonding and/or epitaxial growth.

In certain embodiments, the first semiconductor material 426 can include N-type GaN (e.g., doped with silicon (Si)), and the second semiconductor material 430 can include P-type GaN (e.g., doped with magnesium (Mg)). In other embodiments, the first semiconductor material 426 can include P-type GaN, and the second semiconductor material 430 can include N-type GaN. In further embodiments, the first and second semiconductor materials 426 and 430 can individually include at least one of gallium arsenide (GaAs), aluminum gallium arsenide (AlGaAs), gallium arsenide phosphide (GaAsP), gallium(III) phosphide (GaP), zinc selenide (ZnSe), boron nitride (BN), AlGaN, and/or other suitable semiconductor materials.

The active region 428 can include a single quantum well ("SQW"), MQWs, and/or a bulk semiconductor material. As used hereinafter, a "bulk semiconductor material" generally refers to a single grain semiconductor material (e.g., InGaN) with a thickness greater than about 10 nanometers and up to about 5 micrometers. In certain embodiments, the active region 428 can include an InGaN SQW, GaN/InGaN MQWs, and/or an InGaN bulk material. In other embodiments, the active region 428 can include aluminum gallium indium phosphide (AlGaInP), aluminum gallium indium nitride (AlGaInN), and/or other suitable materials or configurations.

The template structure 420 can facilitate uniform epitaxial growth of the first and second semiconductor materials 426 and 430 and the active region 428. For example, the planar surface 314 can provide a uniform support that reduces warp from the support substrate 302 to the SSL structure 424. Additionally, the template structure 420 can reduce thermal stress during epitaxial growth of the SSL structure 424 because the CTE of the template structure 420 is dominated by the CTE of the ceramic support substrate 202. Thus, the template structure 420 can epitaxially grow SSL structures 424 that have substantially uniform thicknesses and substantially uniform performance characteristics.

Figure 4D:
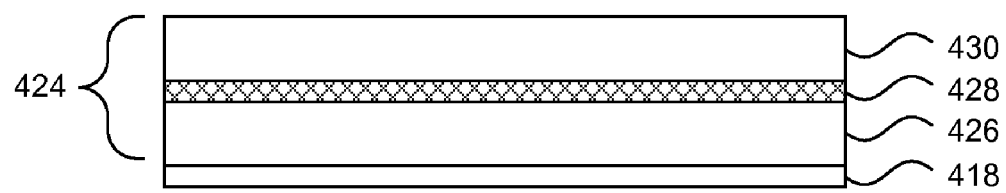

As shown in FIG. 4D, the process can also include removing the support substrate 202 from the formation structure 418 and the SSL structure 424 such that the SSL structure 424 can be used to as part of a device (e.g., cell phone, light, computer). In some embodiments, removing the support substrate 202 can include contacting the support substrate 202 containing polycrystalline AlN with potassium hydroxide (KOH) at a temperature of about 100° C. It has been observed that KOH can react with polycrystalline AlN in the support substrate 202 until a diffusion barrier containing $Si_3N_4$ is exposed. As a result, the diffusion barrier can functions as an etch stop. In other embodiments, the support structure 202 can be removed using CMP, ECMP, and/or other suitable removal techniques.

Figure 5:
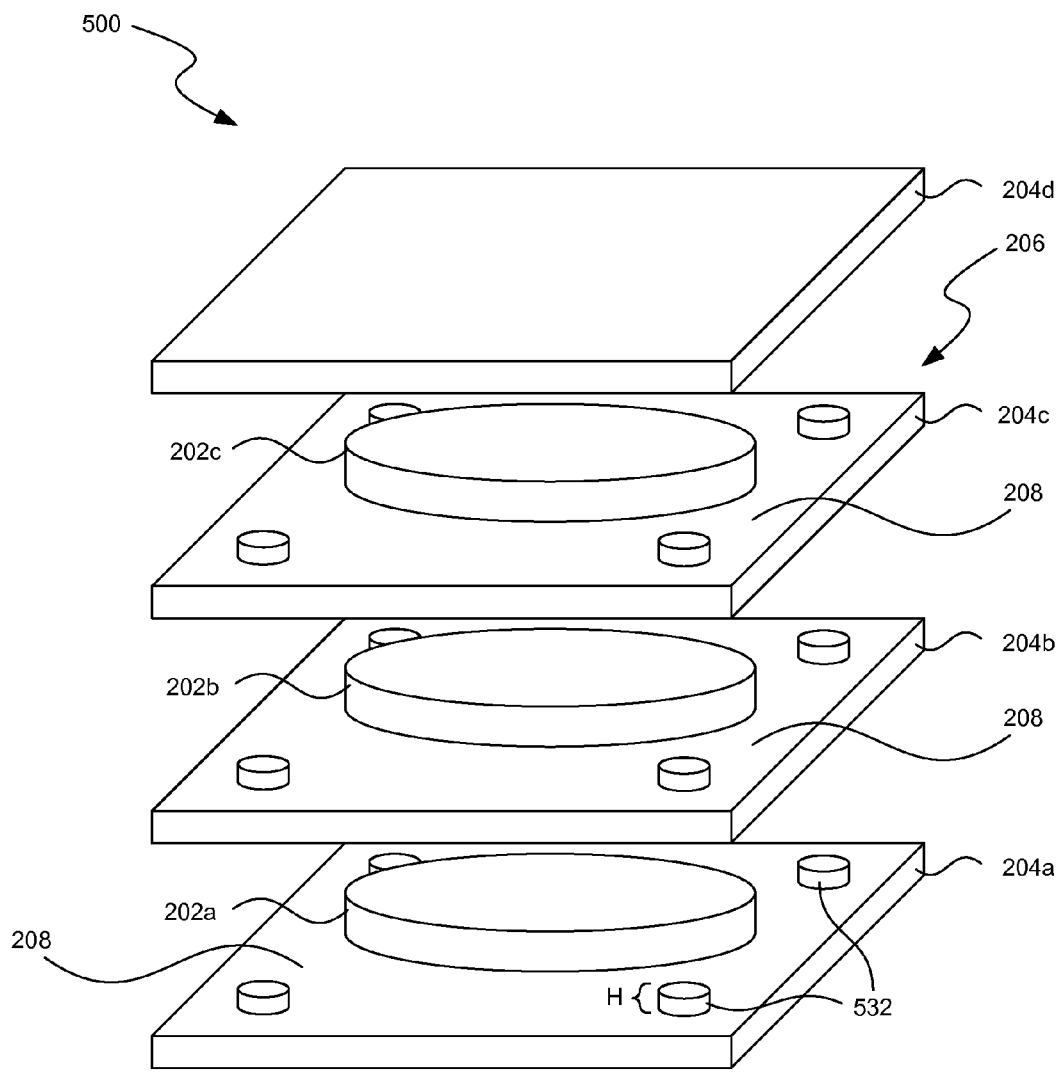
FIG. 5 is an exploded view of an apparatus for manufacturing epitaxial formation support substrates in accordance with other embodiments of the technology.

FIG. 5 is an exploded view of an apparatus 500 for forming epitaxial formation support substrates in accordance with other embodiments of the technology. Several features of the apparatus 500 are generally similar to the features of the apparatus 200 of FIG. 2 and are accordingly not described in detail below. As shown in FIG. 5, the reference plates 204 can further include spacers 532 that can separate the reference plates 204 apart from one another by a height H. The height H can be less than a thickness of the support substrates 202 to ensure the first and second surfaces 208 contact the corresponding first and second sides 210 of the support substrates 202. The spacers 532 can also facilitate a substantially even pressure distribution on each of the support substrates 202. For example, the spacers 532 can prevent the support substrates 202 near the bottom of the stack 206 from receiving more pressure than the support substrates 202 near the top of the stack 206. Additionally, the height H of the spacers 532 can take into account the shrinkage of the material of the support substrates 202 during sintering to ensure the sides 210 remain in contact with the planar surfaces 208.

As shown in the embodiment illustrated in FIG. 5, each reference plate 204 can includes a plurality of the spacers 532 around peripheral portions of the first surfaces 208a. In other embodiments, the spacers 532 can be a single piece, such as a circular protrusion, that can encircle the support substrates 202. The spacers 532 can be affixed to the reference plates 204 using glue and/or other suitable fastening methods. In other embodiments, the spacers 532 can be integrally formed with the reference plates 204. The spacers 532 can be made from a rigid, semi-rigid, and/or flexible material that can withstand the temperatures of firing. For example, in some embodiments, the spacers 532 can be made from aluminum oxide. Additionally, the spacers 532 can be made from a material that can compress to a desired height (e.g., a desired height of the support substrate 202) when the reference plates 204 are stacked and/or pressure is applied to the stack 206. In other embodiments, the reference plates 204 can be spaced apart by a locking mechanism that ensures the reference plates 204 are not spaced an undesirable distance away from one another (e.g., too close, to far) such that a substantially uniform pressure is applied to each of the support substrates 202.

Figure 6:
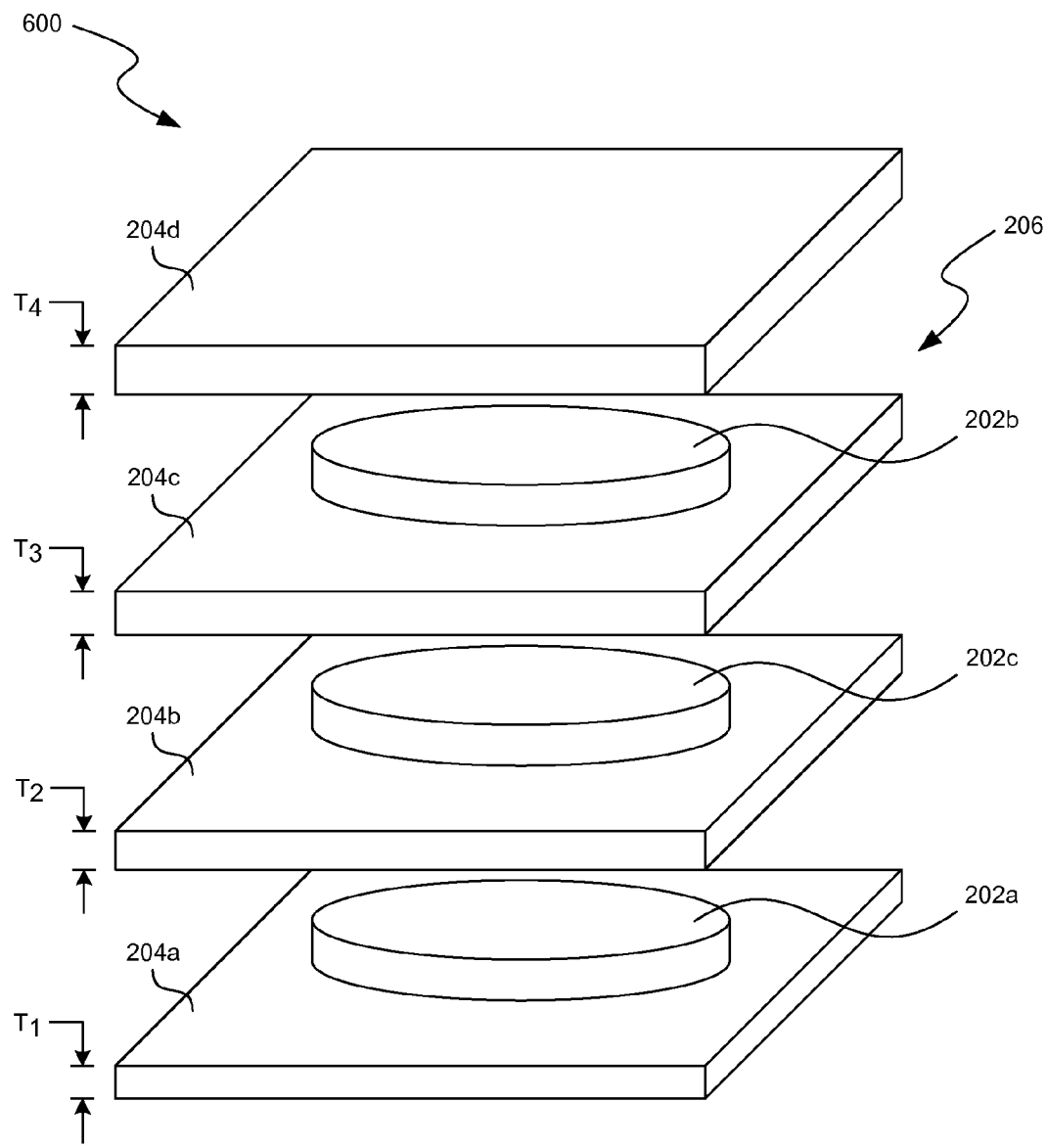
FIG. 6 is an exploded view an apparatus for manufacturing epitaxial formation support substrates in accordance with further embodiments of the technology.

FIG. 6 is an exploded view an apparatus 600 for forming epitaxial formation support substrates in accordance with further embodiments of the technology. Several features of the apparatus 600 are generally similar to the features of the apparatus 200 of FIG. 2 and are accordingly not described in detail below. As shown in FIG. 6, the reference plates 204 can increase in thickness from a first thickness $T_1$ for the first reference plate 204a to a thickness $T_4$ for the fourth reference plate 204d. The mass of the reference plates 204a-d accordingly increases as they are spaced higher in the stack 206. Thus, the support substrates 202 positioned closer to the top of the stack 206 do not experience disproportionately less pressure than the support substrates 202 near the bottom of the stack 206. In other embodiments, the reference plates 204 can be made from different materials such that the reference plates 204 have a greater mass as the reference plates 204 are spaced closer to the top of the stack 206. In other embodiments, the reference plates 204 can compensate for different pressures within the stack 206 using another suitable method.

From the foregoing, it will be appreciated that specific embodiments of the technology have been described herein for purposes of illustration, but that various modifications may be made without deviating from the disclosure. For example, the embodiments described above show a stack of four reference plates. However, other embodiments can include more or less reference plates. Many of the elements of one embodiment may be combined with other embodiments in addition to or in lieu of the elements of the other embodiments. Accordingly, the disclosure is not limited except as by the appended claims.

I claim:

1. A method of manufacturing an epitaxial formation support substrate, comprising:
    positioning a first side of an uncured support substrate against a first surface of a first reference plate, the uncured support substrate having a second side opposite the first side and coefficient of thermal expansion (CTE) substantially similar to N-type gallium nitride (GaN);
    positioning a second surface of a second reference plate against the second side of the uncured support substrate to form a stack, the first and second surfaces of the first and second reference plates including uniformly flat portions in contact with the first and second sides of the uncured support substrate, respectively;
    firing the stack to sinter the uncured support substrate; and
    removing the support substrate from between the first and second reference plates, wherein at least one of the first and second sides of the support substrate includes a planar surface that is at least substantially uniformly flat.

2. The method of claim 1 wherein:
    the uncured support substrate includes a polycrystalline ceramic;
    positioning the uncured support substrate between the first and second reference plates includes positioning the uncured support substrate between plates of $Al_2O_3$;
    firing the stack includes sintering the polycrystalline ceramic; and
    the method further comprises machining the planar surface to increase the flatness of the planar surface, wherein machining is limited to one machine process; and
    attaching a formation structure to the planar surface, the formation structure and the support substrate forming a template structure having a CTE substantially equivalent to the CTE of the support structure, wherein the formation structure includes an Si(1,1,1) portion.

3. The method of claim 1 wherein the uncured support substrate comprises at least one of Si3N4, TiN, ZrN, HfN, AlN, SiO2, Al2O3, AlON, TiC, ZrC, HfC, SiC, and Y2O3.

4. The method of claim 1, further comprising:
    machining the planar surface to increase the flatness of the planar surface, wherein machining is limited to a single machine process.

5. The method of claim 4 wherein machining comprises at least one of polishing, grinding, and lapping.

6. The method of claim 1 wherein the uncured support substrate is one of a plurality of uncured support substrates, the first and second reference plates are two of a plurality of reference plates, and the method further comprises:
    alternatingly stacking the uncured support substrates and the reference plates to form the stack.

7. The method of claim 6 wherein the reference plates increase in mass as the reference plates are spaced higher in the stack.

8. The method of claim 1 wherein the uncured support substrate has a first height, and the method further comprises:
    positioning a spacer between the first and second reference plates, the spacer having a second height less than the first height.

9. The method of claim 8 wherein the spacer is one of a plurality of spacers, the spacers being positioned around a peripheral portion of at least one of the first and second surfaces.

10. The method of claim 8 wherein the spacer is a protusion extending from the first surface of the first reference plate, the protrusion surrounding the uncured support substrate.

11. The method of claim 1, further comprising:
    applying a releasing agent to at least one of the first side of the support substrate and the first surface of the first reference plate and at least one of the second side of the support substrate and the second surface of the second reference plate.

12. The method of claim 1 wherein the uncured support substrate is one of a plurality of uncured support substrates and wherein the method further includes forming the uncured support substrate by:
    forming a sheet of polycrystalline ceramic from a ceramic slurry; and
    extruding the plurality of uncured support substrates from the sheet.

13. The method of claim 1 wherein the uncured support substrate further includes a sintering agent to a polycrystalline ceramic.

14. The method of claim 1, further comprising:
    bonding a formation structure to the planar surface, the formation structure including an Si(1,1,1) wafer; and
    epitaxially growing a first semiconductor material on the formation structure, an active region on the first semiconductor material, and a second semiconductor material on the active region, the first semiconductor material containing N-type gallium nitride (GaN), the second semiconductor material containing P-type GaN, and the active region including at least one of a bulk indium gallium nitride (InGaN), an InGaN single quantum well, and Gan/InGaN multiple quantum wells.

15. A method of manufacturing a solid state lighting (SSL) device, comprising:
firing a support substrate between reference plates, the support substrate having a first side, a second side opposite the first side, and a first coefficient of thermal expansion (CTE) substantially similar to a CTE of N-type gallium nitride (GaN), and the reference plates having uniformly flat surface contacting the first and second sides of the support substrate, and wherein at least one of the first and second sides of the support substrate includes a planar surface that is at least substantially uniformly flat;
attaching a formation structure to the planar surface, to form a template structure, the formation structure having a second CTE different from the first CTE, and the template structure having a CTE substantially similar to the first CTE; and
epitaxially growing an SSL structure on the formation structure.

16. The method of claim 15 wherein the support substrate has a first side and a second side opposite the first side, the planar surface being at one of the first and second sides, and wherein:
firing the support substrate includes firing an uncured polycrystalline ceramic;
attaching the formation structure includes bonding the formation structure to the planar surface, the formation structure including an Si(1,1,1) wafer;
the method further includes reducing a thickness of the formation structure after the formation structure is attached to the support substrate; and
epitaxially growing the SSL structure includes forming a first semiconductor material, an active region, and a second semiconductor material on the formation structure, the first semiconductor material containing N-type gallium nitride (GaN), the second semiconductor material containing P-type GaN, and the active region including at least one of a bulk indium gallium nitride (InGaN), an InGaN single quantum well, and Gan/InGaN multiple quantum wells.

17. The method of claim 16 wherein the polycrystalline ceramic includes at least one of Si3N4, TiN, ZrN, HfN, AlN, SiO2, Al2O3, AlON, TiC, ZrC, HfC, SiC, and Y2O3.

18. The method of claim 15, further comprising:
reducing a thickness of the formation structure after the formation structure is attached to the support substrate, wherein a remaining thickness of the formation structure is such that the CTE of the template structure is dominated by first CTE of the support substrate.

19. The method of claim 18 wherein reducing a thickness further comprises:
implanting a dopant after the formation structure; and exfoliating the dopant.

20. The method of claim 15 wherein attaching the formation structure includes bonding an Si(1,1,1) wafer to the planar surface.

21. The method of claim 15 wherein:
epitaxial growing the SSL structure includes forming a first semiconductor material, an active region, and a second semiconductor material on the formation structure with the reduced thickness, the first semiconductor material containing N-type gallium nitride (GaN), the second semiconductor material containing P-type GaN, and the active region including at least one of a bulk indium gallium nitride (InGaN), an InGaN single quantum well, and Gan/InGaN multiple quantum wells.

22. The method of claim 15 wherein epitaxially growing the SSL structure transmits less than 25 micrometers of warp from the template structure to the SSL structure.

23. The method of claim 15, further comprising:
removing the support substrate from the formation structure.

* * * * *

UNITED STATES PATENT AND TRADEMARK OFFICE
CERTIFICATE OF CORRECTION

PATENT NO. : 8,187,901 B2
APPLICATION NO. : 12/961370
DATED : May 29, 2012
INVENTOR(S) : Calvin Wade Sheen Page 1 of 1

It is certified that error appears in the above-identified patent and that said Letters Patent is hereby corrected as shown below:

In column 8, line 41, in Claim 10, delete "protusion" and insert -- protrusion --, therefor.

In column 9, line 5, in Claim 14, delete "Gan" and insert -- GaN --, therefor.

In column 10, line 5, in Claim 16, delete "Gan" and insert -- GaN --, therefor.

In column 10, line 32, in Claim 21, delete "Gan" and insert -- GaN --, therefor.

Signed and Sealed this
Thirty-first Day of July, 2012

David J. Kappos
*Director of the United States Patent and Trademark Office*